United States Patent
Döllgast et al.

(10) Patent No.: US 10,374,141 B2
(45) Date of Patent: Aug. 6, 2019

(54) METHOD FOR PRODUCING A PIEZOELECTRIC MULTILAYER COMPONENT, PIEZOELECTRIC MULTILAYER COMPONENT CONTAINING AN AUXILIARY MATERIAL, AND USE OF AN AUXILIARY MATERIAL FOR SETTING THE BREAKING STRESS OF A PIEZOELECTRIC MULTILAYER COMPONENT

(75) Inventors: Bernhard Döllgast, Deutschlandsberg (AT); Wolfgang Athenstaedt, Graz (AT); Marion Ottlinger, Deutschlandsberg (AT); Marlene Fritz, Graz (AT)

(73) Assignee: EPCOS AG, Munich (DE)

( * ) Notice: Subject to any disclaimer, the term of this patent is extended or adjusted under 35 U.S.C. 154(b) by 1186 days.

(21) Appl. No.: 14/235,441

(22) PCT Filed: Jun. 26, 2012

(86) PCT No.: PCT/EP2012/062344
§ 371 (c)(1),
(2), (4) Date: Jun. 5, 2014

(87) PCT Pub. No.: WO2013/017342
PCT Pub. Date: Feb. 7, 2013

(65) Prior Publication Data
US 2014/0292161 A1    Oct. 2, 2014

(30) Foreign Application Priority Data

Jul. 29, 2011 (DE) .......................... 10 2011 109 008

(51) Int. Cl.
| | |
|---|---|
| *H01L 41/083* | (2006.01) |
| *H01L 41/273* | (2013.01) |
| *H01L 41/18* | (2006.01) |
| *H01L 41/312* | (2013.01) |
| *H01L 41/187* | (2006.01) |

(52) U.S. Cl.
CPC ........ *H01L 41/0838* (2013.01); *H01L 41/183* (2013.01); *H01L 41/1876* (2013.01); *H01L 41/273* (2013.01); *H01L 41/312* (2013.01)

(58) Field of Classification Search
CPC . H01L 41/047; H01L 41/083; H01L 41/0926; H03H 9/131
(Continued)

(56) References Cited

U.S. PATENT DOCUMENTS

| | | | | |
|---|---|---|---|---|
| 5,802,686 A | * | 9/1998 | Shimada | .............. B41J 2/14233 216/27 |
| 5,840,785 A | * | 11/1998 | Allen | .................... B22F 1/0059 523/145 |

(Continued)

FOREIGN PATENT DOCUMENTS

| | | |
|---|---|---|
| DE | 10164314 A1 | 8/2002 |
| DE | 102007010239 A1 | 9/2008 |

(Continued)

*Primary Examiner* — Bryan P Gordon
(74) *Attorney, Agent, or Firm* — Morgan, Lewis & Bockius LLP

(57) ABSTRACT

Provision is made of a method for producing a piezoelectric multilayer component (1), in which piezoelectric green sheets, at least one ply (21) containing an auxiliary material having a first and a second component and layers (20) containing electrode material are arranged one above another alternately and sintered, wherein, during the sintering, the first and second components of the auxiliary material chemically react, and the at least one ply (21) containing the auxiliary material is degraded. In addition, provision is made of a piezoelectric multilayer component (1) comprising a plurality of alternating layers of electrode material (20) and piezoelectric ceramic and at least one layer (21) of auxiliary material having a breaking load which is reduced compared to the other layers of electrode material, wherein, in addition to the first and second components, the auxiliary (Continued)

Figure 1:
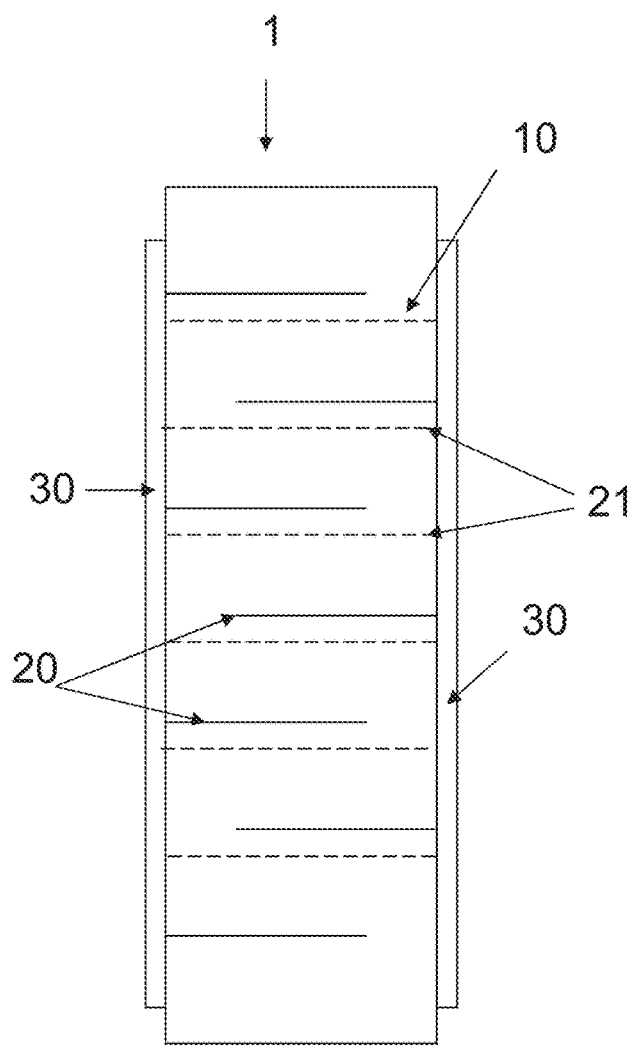

material comprises a fifth component, which, at the preferred sintering temperatures for the piezoelectric material, in particular at most 1050° C., at most has a negligible sintering activity and does not react with the piezoelectric material used. Finally, the use of $ZrO_2$, $BaTiO_3$ or a mixture thereof in the auxiliary material layer of a piezoelectric multilayer component for reducing the breaking stress is described.

16 Claims, 15 Drawing Sheets

(58) Field of Classification Search
USPC .................................. 310/363, 364, 365, 366
See application file for complete search history.

(56) References Cited

U.S. PATENT DOCUMENTS

| | | |
|---|---|---|
| 2002/0121329 A1 | 9/2002 | Shindo et al. |
| 2007/0138918 A1* | 6/2007 | Takahashi ............... C01G 33/00 310/358 |
| 2008/0282536 A1* | 11/2008 | Bamiere ............... C04B 35/493 29/846 |
| 2009/0289130 A1* | 11/2009 | Okamura ............ H01L 41/0838 239/585.1 |
| 2009/0295256 A1* | 12/2009 | Okamura ............ H01L 41/0471 310/363 |
| 2010/0066214 A1 | 3/2010 | Feltz et al. |
| 2010/0320876 A1 | 12/2010 | Dernovsek et al. |

FOREIGN PATENT DOCUMENTS

| | | |
|---|---|---|
| EP | 1702905 A1 | 9/2006 |
| EP | 2099081 A1 | 9/2009 |
| JP | 2002260950 A | 9/2002 |
| JP | 2007043094 A | 2/2007 |
| JP | 2008072746 A | 3/2008 |
| JP | 2011029272 A | 2/2011 |
| JP | 2011510505 A | 3/2011 |
| JP | 2011082534 A | 4/2011 |
| JP | 2013518399 A | 5/2013 |
| WO | WO-2008072746 A1 | 6/2008 |
| WO | 2009/092584 A1 | 7/2009 |
| WO | WO-2009/092585 A1 | 7/2009 |

* cited by examiner

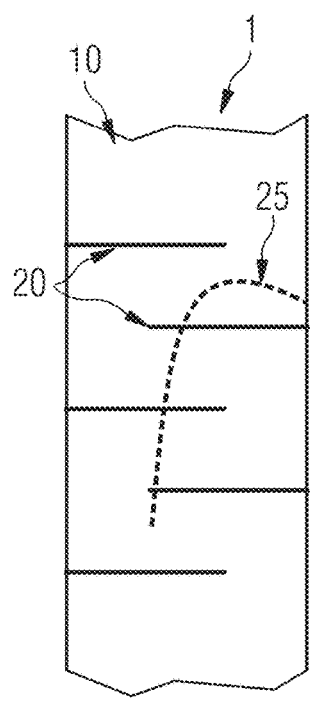
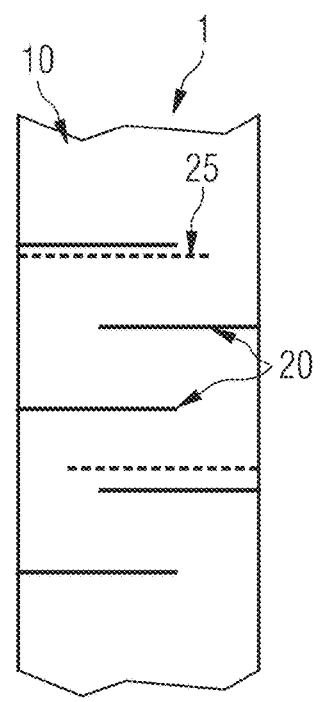

| Micrograph with ZrO$_2$ in a porous layer |
|---|
|  |
| High porosity through inclusion of ZrO$_2$ |

| Micrograph without a fifth component in a porous layer |
|---|
|  |
| Low porosity without ZrO$_2$/BaTiO$_3$ |

| Breakage face with ZrO$_2$ in a porous layer |
|---|
|  2mm |
| Breaking stress between 5-8 MPa |

| Micrograph without a fifth component in a porous layer |
|---|
|  2mm |
| Breaking stress between 23-34 MPa |

| Spectrum Designation | Elem % O K | Elem % Ti K | Elem % Zr L | Elem % Pb M |
|---|---|---|---|---|
| Spectrum 4 | 31.93 | 0.08 | 60.21 | 7.78 |
| Spectrum 5 | 40.68 | 0.49 | 53.35 | 5.48 |
| Spectrum 6 | 17.41 | 6.39 | 15.88 | 60.31 |

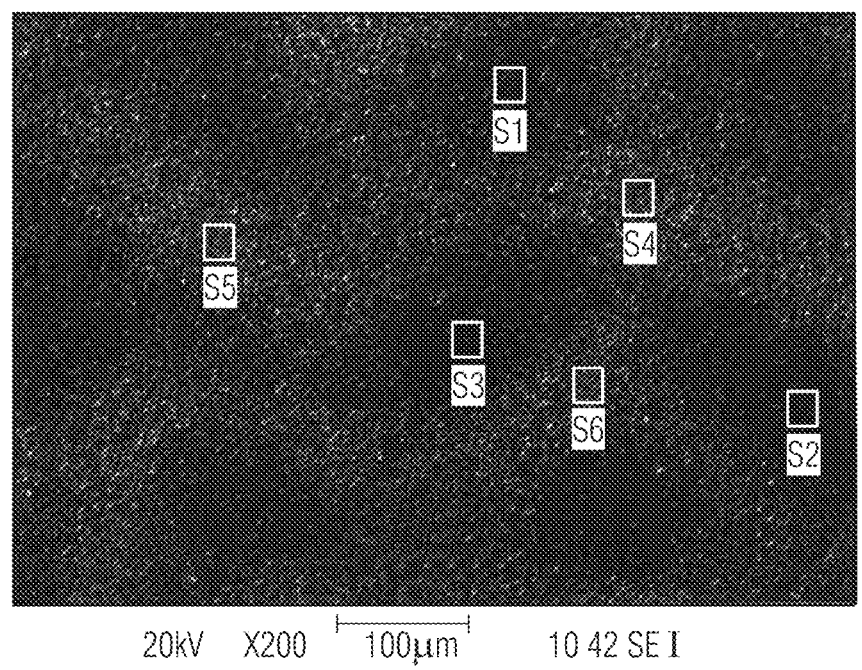

| Spectrum Designation | Elem % O K | Elem % Ti K | Elem % Zr L | Elem % Nd L | Elem % Pb M |
|---|---|---|---|---|---|
| Spectrum 1 | 12.45 | 6.94 | 15.66 | 1.02 | 63.92 |
| Spectrum 2 | 12.50 | 7.23 | 15.44 | 1.02 | 63.81 |
| Spectrum 3 | 12.54 | 7.52 | 15.06 | 0.86 | 64.02 |
| Spectrum 4 | 13.46 | 6.82 | 15.10 | 1.13 | 63.48 |
| Spectrum 5 | 13.13 | 7.28 | 15.56 | 0.45 | 36.58 |
| Spectrum 6 | 13.26 | 7.36 | 14.85 | 0.81 | 63.72 |

| Micrograph with BaTiO3 in a porous layer |
|---|
|  |
| High porosity through inclusion BaTiO3 |

| Micrograph without a fifth component in a porous layer |
|---|
|  |
| Low porosity without a fifth component |

| Breakage pattern with BaTiO3 in a porous layer |
|---|
|  2mm |
| Breaking stress between 10-19 MPa |

| Breakage pattern without a fifth component in a porous layer |
|---|
|  2mm |
| Breaking stress between 23-34 MPa |

FIG 11c

| Spectrum Designation | Elem % O K | Elem % Ti K | Elem % Cu K | Elem % Zr L | Elem % Ba L | Elem % Nd L | Elem % Pb M |
|---|---|---|---|---|---|---|---|
| Spectrum 9 | 11.47 | 7.44 | 0.53 | 15.92 | 0.12 | 0.93 | 63.59 |
| Spectrum 10 | 12.71 | 7.48 | -0.06 | 17.53 | -0.20 | 0.90 | 61.64 |
| Spectrum 11 | 12.44 | 7.42 | -0.12 | 15.89 | 0.13 | 1.41 | 62.84 |
| Spectrum 12 | 12.71 | 7.71 | -0.20 | 14.72 | -0.04 | 1.01 | 64.10 |
| Spectrum 13 | 13.47 | 7.58 | 0.19 | 14.46 | 0.62 | 0.95 | 62.73 |
| Spectrum 14 | 13.37 | 7.28 | 0.11 | 14.85 | 0.88 | 1.15 | 62.35 |

FIG 12c

| Spectrum Designation | Elem % O K | Elem % Ti K | Elem % Zr L | Elem % Ba L | Elem % Nd L | Elem % Pb M |
|---|---|---|---|---|---|---|
| Spectrum 5 | 13.72 | 7.30 | 14.55 | 0.11 | 1.11 | 63.21 |
| Spectrum 6 | 14.08 | 7.58 | 14.70 | -0.69 | 0.82 | 63.50 |
| Spectrum 7 | 13.18 | 7.40 | 14.69 | -0.21 | 1.04 | 63.90 |
| Spectrum 8 | 13.85 | 6.96 | 14.42 | 1.04 | 0.93 | 62.80 |

METHOD FOR PRODUCING A PIEZOELECTRIC MULTILAYER COMPONENT, PIEZOELECTRIC MULTILAYER COMPONENT CONTAINING AN AUXILIARY MATERIAL, AND USE OF AN AUXILIARY MATERIAL FOR SETTING THE BREAKING STRESS OF A PIEZOELECTRIC MULTILAYER COMPONENT

DESCRIPTION

Provision is made of a method for producing a piezoelectric multilayer component, in which a stack of piezoelectric green sheets, at least one ply containing an auxiliary material and layers of electrode material is formed and sintered. What is furthermore described is a piezoelectric multilayer component containing an auxiliary material, and the use of an auxiliary material for setting the breaking stress of a piezoelectric multilayer component.

The method can be used, for example, to produce a piezo actuator, which can be used to operate an injection valve in a motor vehicle.

The reliability of piezoelectric multilayer components depends on the control over cracks possibly occurring during their production. Such cracks may, for example, occur during thermal processes such as sintering, metallization and soldering or during the polarization, since elastic stresses are formed owing to different expansions in various regions of the component. Such so-called relaxation cracks or poling cracks may furthermore change direction, extend perpendicularly to the electrodes and therefore for example bridge two electrodes, which leads to a short circuit and to failure of the component.

One object to be achieved is to provide a method for producing a piezoelectric multilayer component which has increased reliability. This object is achieved by a method according to patent claim 1. Further embodiments of the method are the subject of further patent claims.

Provision is made of a method for producing a piezoelectric multilayer component, comprising the steps of:
A) providing an electrode material and green sheets containing a piezoelectric material,
B) providing an auxiliary material, which contains at least a first and a second component,
C) forming a stack, in which piezoelectric green sheets, at least one ply containing the auxiliary material and layers containing the electrode material are arranged one above another alternately,
D) sintering the stack,
wherein the first and second components of the auxiliary material chemically react during method step D), and the at least one ply is degraded.

This method produces a piezoelectric multilayer component which comprises piezoelectric ceramic layers with internal electrodes arranged between them and also at least one weakening layer.

The piezoelectric green sheets may comprise a material which can be sintered to form lead zirconate titanate (PZT) ceramic.

"Alternately" in relation to the stack formed in method step C) may also mean that a layer of electrode material or a ply of auxiliary material is not applied to every green sheet. By way of example, some piezoelectric green sheets may be arranged one above another, without there being any layers of electrode material between them.

The layers of electrode material form the internal electrodes in the finished multilayer component, and they may be applied to the green sheets as a metal paste, for example by means of a screen printing method.

If more than one ply containing the auxiliary material are arranged in the stack in method step C), they can be present at regular or irregular intervals in the stack. According to one embodiment, the plies containing the auxiliary material can be arranged parallel or largely parallel to two layers containing electrode material and adjacent to two green sheets.

The method makes it possible to control the formation of regions in the multilayer component in which cracks can form in a targeted manner by virtue of the fact that the ply containing the auxiliary material is degraded during the method. By virtue of a suitable selection of the components of the auxiliary material, these are largely or entirely no longer present in the finished component, while a weakening layer forms at the position of the ply, in the region of which there is a predetermined breaking point in the multilayer component. If cracks form, they run out in the component in the region of the weakening layer. The formation of uncontrolled cracks can thus be reduced or prevented.

The stack formed in method step C) is subsequently compressed, and then the green sheets, the at least one ply containing the auxiliary material and the layers of electrode material are sintered together in method step D), so that a multilayer component consisting of piezoelectric layers with internal electrodes arranged between them and at least one weakening layer is formed.

According to one embodiment, the electrode material and the auxiliary material can be selected in such a way that they contain the same metal, which is present in a smaller proportion in the electrode material than in the auxiliary material. In this context, the term "metal" is to be understood as a general designation, and therefore encompasses, for example, pure metals, metal alloys and metal cations, irrespective of their states of matter. The metal can therefore be present in the auxiliary material in bound form, for example as a metal oxide, as the first component and in pure form as the second component.

"In a smaller proportion" is to be understood as meaning that the total concentration of the metal is lower in the electrode material than in the auxiliary material. This difference in concentration has the effect that, during the sintering in method step D), diffusion of the metal can take place from the ply toward at least one of the layers containing electrode material. This diffusion is effected here through the piezoelectric layers adjacent to the ply. Diffusion of the metal is possible, for example, if the metal is present in the vapor phase, as a metal oxide or as pure metal. The mobility of the metal into the piezoelectric layers is given by the difference in concentration as a driving force.

The first component can be present in the auxiliary material in a proportion of 10 to 90% by weight, preferably of 25 to 75% by weight, in particular of 50% by weight.

According to one embodiment, in method step D), the first and second components can react to form a third component and/or the first component can decompose into a third and a fourth component and the fourth component can react with the second component to form the first component. With these reactions, the first and the second component of the auxiliary material can react largely or entirely to form the third component after a certain time.

If, for example, the second component is the metal which is also present, for example, as an alloy in the electrode material in pure form, the method has the effect that, by targeted addition of the first component to the second component in the ply containing the auxiliary material, the pure metal in the auxiliary material is subjected to chemical reactions, whereas the metal in the electrode material is not chemically altered or is chemically altered only to small proportions.

In this case, the first component can contain the same metal as the second component and the electrode material, or can contain a metal which differs from the metal of the second component and of the electrode material. If different metals are selected in the first and second components, a primary third component, the decomposition product of the first component, and a secondary third component, the reaction product from the second component and the fourth component, can form.

The decomposition of the first component into the third and fourth components can be, for example, oxygen elimination of a metal oxide. The first component can therefore be a metal oxide, in which the metal is present in a first oxidation stage and which eliminates oxygen, i.e. the fourth component. A metal oxide in which the metal is present in a second oxidation stage can form as the third component owing to the elimination of oxygen. The metal can therefore be oxidized in a targeted manner in the region of the ply by the oxygen elimination.

Said reactions, in particular the decomposition of the first component into the third and fourth components, can take place before the maximum sintering temperature is reached. Therefore, the targeted oxidation takes place before the maximum sintering temperature is reached and therefore before the compaction of the component.

The method therefore makes it possible to areally restrict a chemical reaction, for example the oxidation of a metal, in a targeted manner, specifically to the region of the ply which contained the auxiliary material before the sintering. Therefore, the pure metal in the ply can be completely oxidized, whereas the metal in the electrode material is not attacked or is attacked scarcely.

In conventional methods, in which the oxidation is controlled merely by way of the sintering atmosphere, areally targeted oxidation cannot be achieved, since the oxidation also takes place at the electrode material; this is undesirable since firstly oxidized electrode material can diffuse away and therefore dissolve the electrode layer, and secondly the ply which is to be formed into the weakening layer cannot be completely degraded.

Furthermore, in method step D), the third component and/or the first component can diffuse toward at least one of the layers containing electrode material.

"Diffuse" is to be understood as meaning that the first and/or third component diffuse to such an extent that they are absorbed by the electrode material or that they diffuse only in the direction of the electrode material and are absorbed by the piezoelectric material through which they diffuse. The second variant takes place, for example, when the first and third components contain no metal which is present in the electrode material.

Once the reactions have been completed, only the third component, which can diffuse, is still present, although it is also possible for residues of the first component to also be present, and these can then likewise diffuse. As a result, the metal oxides which have formed or are already present, in which the metal is present in respectively different oxidation stages, can therefore diffuse toward the electrode material. In this case, the metal diffuses as a cation.

The diffusion can take place once the components have chemically reacted, i.e. when largely only the third component is still present in the ply. The diffusion can also already begin as the aforementioned reactions of the components are still taking place. Furthermore, the diffusion can take place when the maximum sintering temperature has been reached.

A weakening layer can be formed by the diffusion in the region of the ply in the stack. The ply, which contained the auxiliary material before method step D), is therefore degraded, in that the first and second components of the auxiliary material react to form a third component owing to the action of the temperature used for sintering, and as a result make it possible for the first and/or third component to diffuse in the direction of the electrode layers. A porous weakening layer, which can also be understood to be a weakening region, in which the second component has completely reacted and the third component and, if still present, the first component have diffused away, therefore forms in the region of the ply.

According to one embodiment, CuO can be selected as the first component, Cu can be selected as the second component and a Cu alloy can be selected as the electrode material. If the Cu-containing components are selected, the diffusion in method step D) can take place in the form of copper oxides. According to a further embodiment, $Pb_3O_4$ can be selected as the first component, Cu can be selected as the second component and a Cu alloy can be selected as the electrode material.

According to one embodiment, the auxiliary material can comprise a fifth component, which, at the preferred sintering temperatures for the piezoelectric material, in particular at most 1050° C., at most has a negligible sintering activity and does not react with the piezoelectric material used. The fifth component is preferably incorporated in the auxiliary material layer as a loose bed.

It is preferable that the fifth component is a ceramic material.

It is preferable that the specific surface area both of the copper oxide (CuO) and of the fifth component is selected in such a manner that the most homogeneous dispersion possible takes place. It is further preferable that the specific surface area of the copper oxide and of the fifth component is between 8 and 15 $m^2/g$.

In one embodiment, the fifth component can comprise an element selected from the group consisting of zirconium dioxide, barium titanate and a mixture thereof The fifth component preferably comprises zirconium dioxide.

In one embodiment, the fifth component can have a silicon content of at most 100 ppm. As a result, the sintering activity is diminished and consequently the breaking stress is reduced.

In a preferred embodiment, CuO is selected as the first component, Cu is selected as the second component, $ZrO_2$ is selected as the fifth component and a Cu alloy is selected as the electrode material.

Further metal systems are similarly conceivable if a first component which eliminates oxygen can be selected therefor, for example.

After the sintering, external electrodes can furthermore be applied to two opposing external faces of the multilayer component. To this end, a base metallization can be fired on the stack, for example. The internal electrodes are preferably connected to the external electrodes alternately along the stacking direction of the component. To this end, the internal electrodes are led for example alternately as far as one of the external electrodes and are at a distance from the second external electrode. In this way, the internal electrodes of one polarity are electrically connected to one another via a common external electrode.

In a further aspect of the invention, provision is made of a piezoelectric multilayer component comprising a plurality of alternating layers of electrode material and piezoelectric ceramic and at least one layer of auxiliary material having a breaking load which is reduced compared to the other layers of electrode material, wherein the auxiliary material comprises a fifth component, as defined above.

It is preferable that the multilayer component has a breaking stress of 10 MPa to 25 MPa, further preferably 10 MPa to 20 MPa, particularly preferably 10 MPa to 15 MPa. The reliability of the component is increased by a lower maximum breaking load. On the other hand, breakages already occur during the thermal processes and during grinding given a breaking load of less than 10 MPa, as a result of which the yield is reduced.

A further aspect of the invention is directed to the use of $ZrO_2$, $BaTiO_3$ or a mixture thereof in the auxiliary material layer of a piezoelectric multilayer component for reducing the breaking stress.

The specified method and the advantageous configurations thereof will be explained hereinbelow with the aid of schematic figures, which are not true to scale, and with the aid of an exemplary embodiment.

FIG. 1 shows the schematic side view of a multilayer component produced by the method.

FIGS. 2a) and b) show enlarged schematic side views of a multilayer component.

Figure 3A:
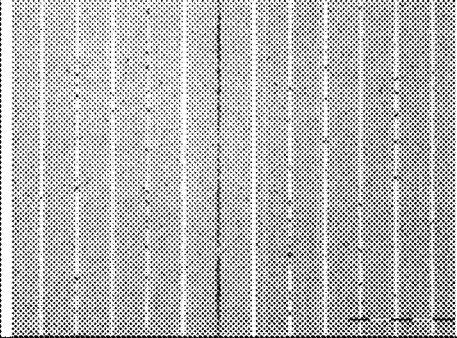

FIGS. 3a) and b) show micrographs of a component having an auxiliary material layer each comprising $ZrO_2$ and without a fifth component.

Figure 4A:
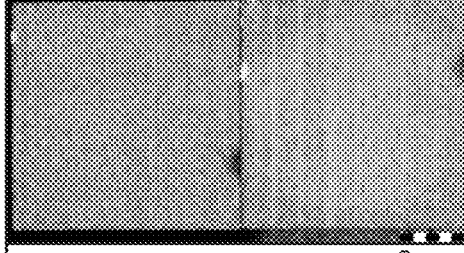
Figure 4B:
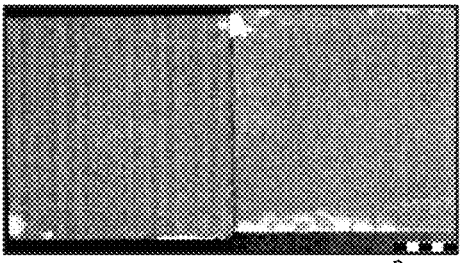

FIGS. 4a) and b) show a component having an auxiliary material layer each comprising $ZrO_2$ and without a fifth component after a breaking test.

Figure 5A:
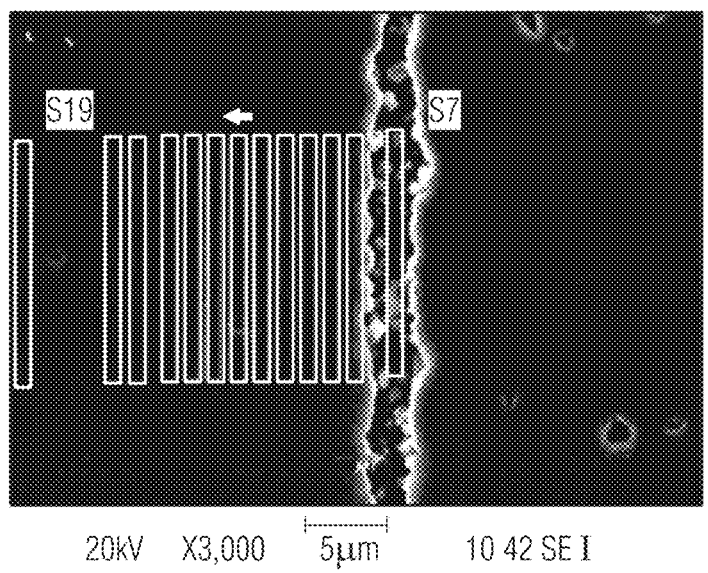

FIGS. 5a) to c) show a scanning electron microscope image of a component comprising $ZrO_2$ in the auxiliary material layer and also an EDX analysis and mapping of the image.

Figure 6A:
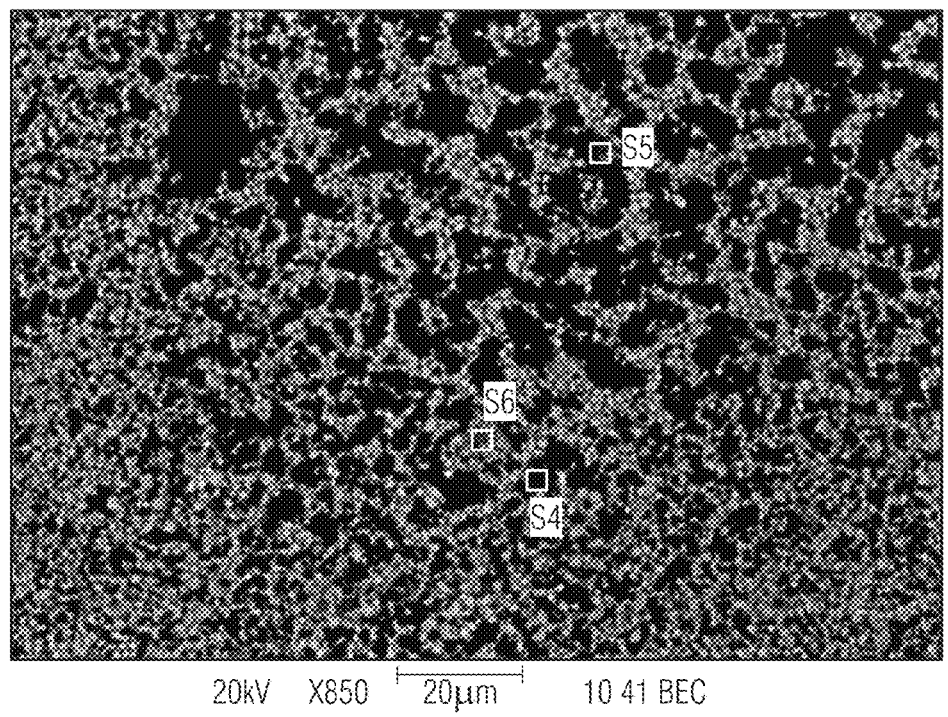

FIGS. 6a) to c) show a scanning electron microscope image of a breakage face of a component comprising $ZrO_2$ in the auxiliary material layer and also an EDX analysis and mapping of the image.

FIGS. 7a) to c) show a scanning electron microscope image of a breakage face of a component without a fifth component in the auxiliary material layer and also an EDX analysis and mapping of the image.

Figures 7C, 8A:
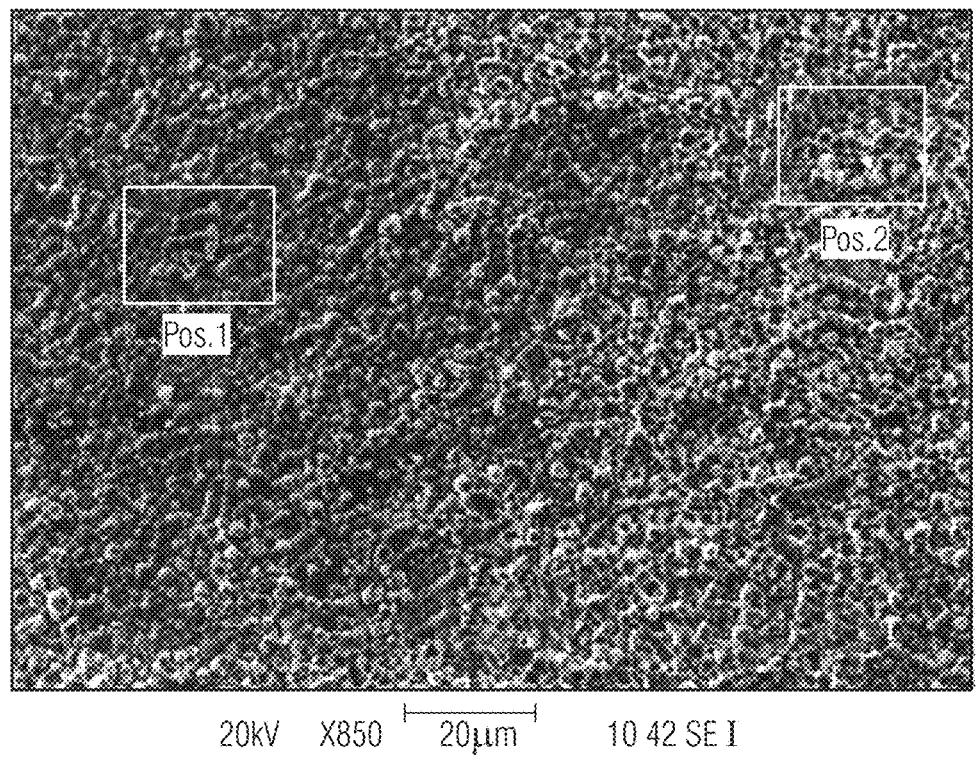

FIGS. 8a) to c) show scanning electron microscope images of a breakage face of a component without a fifth component in the auxiliary material layer, with differences in the grain structure being shown.

Figure 9A:
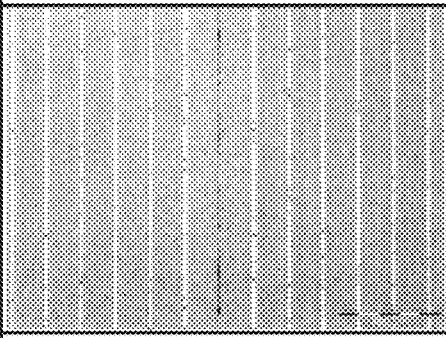

FIGS. 9a) and b) show micrographs of a component having an auxiliary material layer each comprising $BaTiO_3$ and without a fifth component.

Figure 10A:
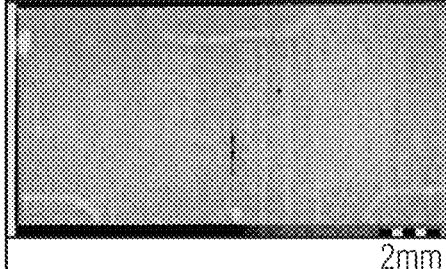
Figure 10B:
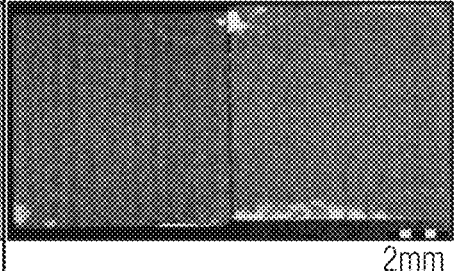

FIGS. 10a) and b) show a component having an auxiliary material layer each comprising $BaTiO_3$ and without a fifth component after a breaking test.

Figure 11A:
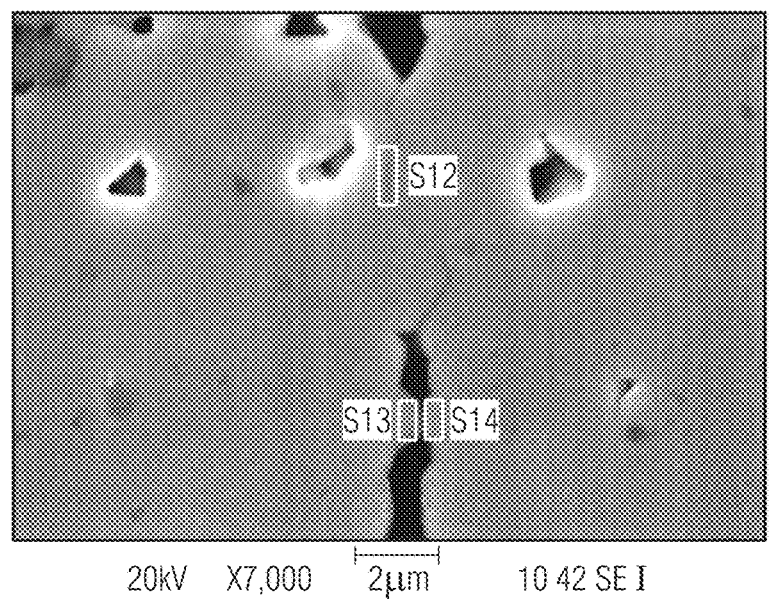
Figure 11B:
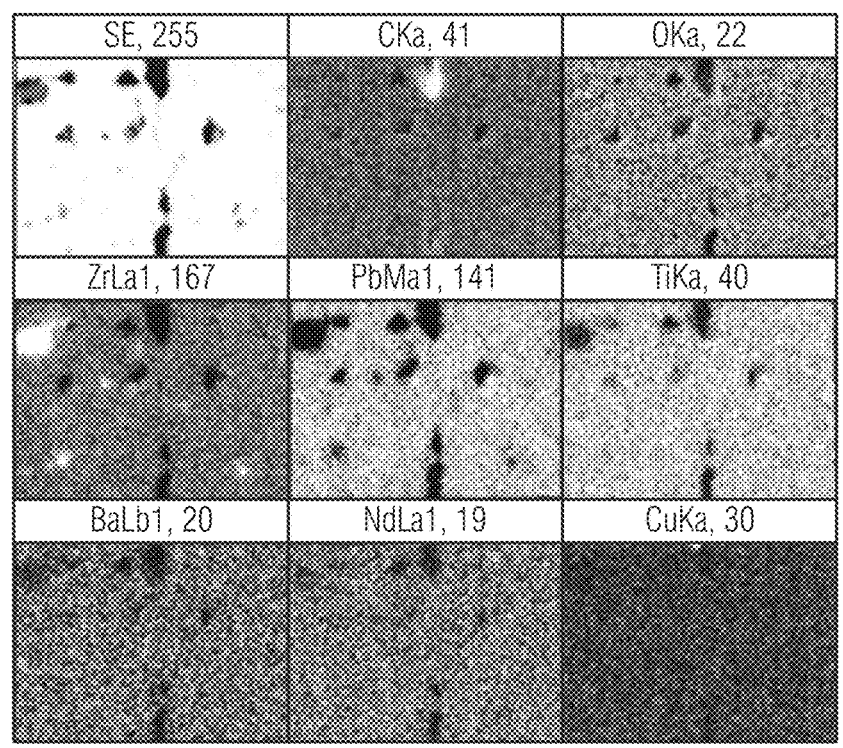

FIGS. 11a) to c) show a scanning electron microscope image of a component comprising $BaTiO_3$ in the auxiliary material layer and also mapping of the image and an EDX analysis.

Figure 12A:
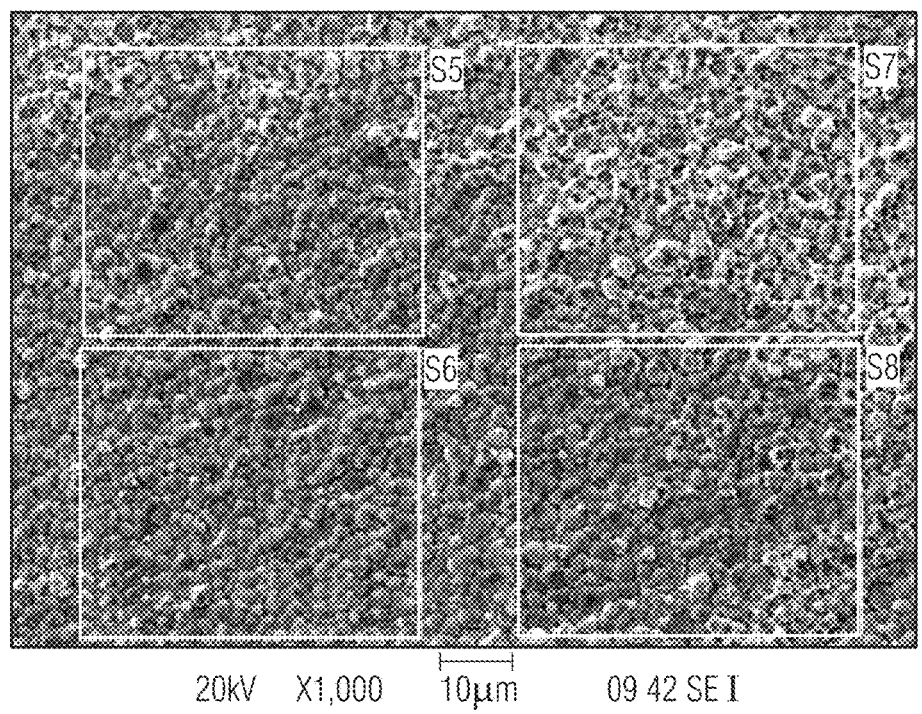
Figure 12B:
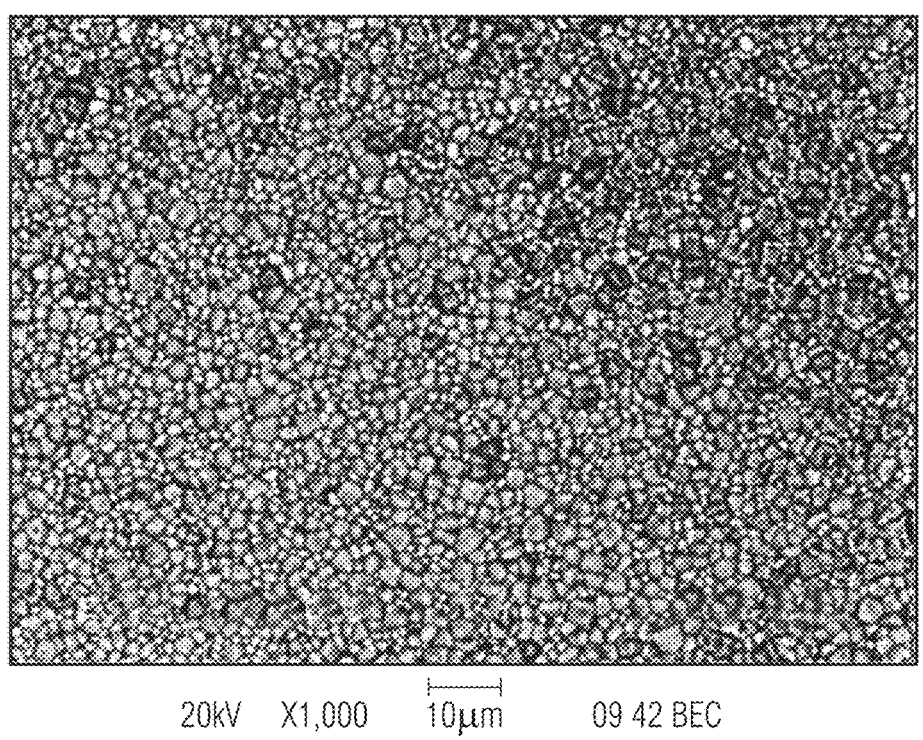
Figure 12D:
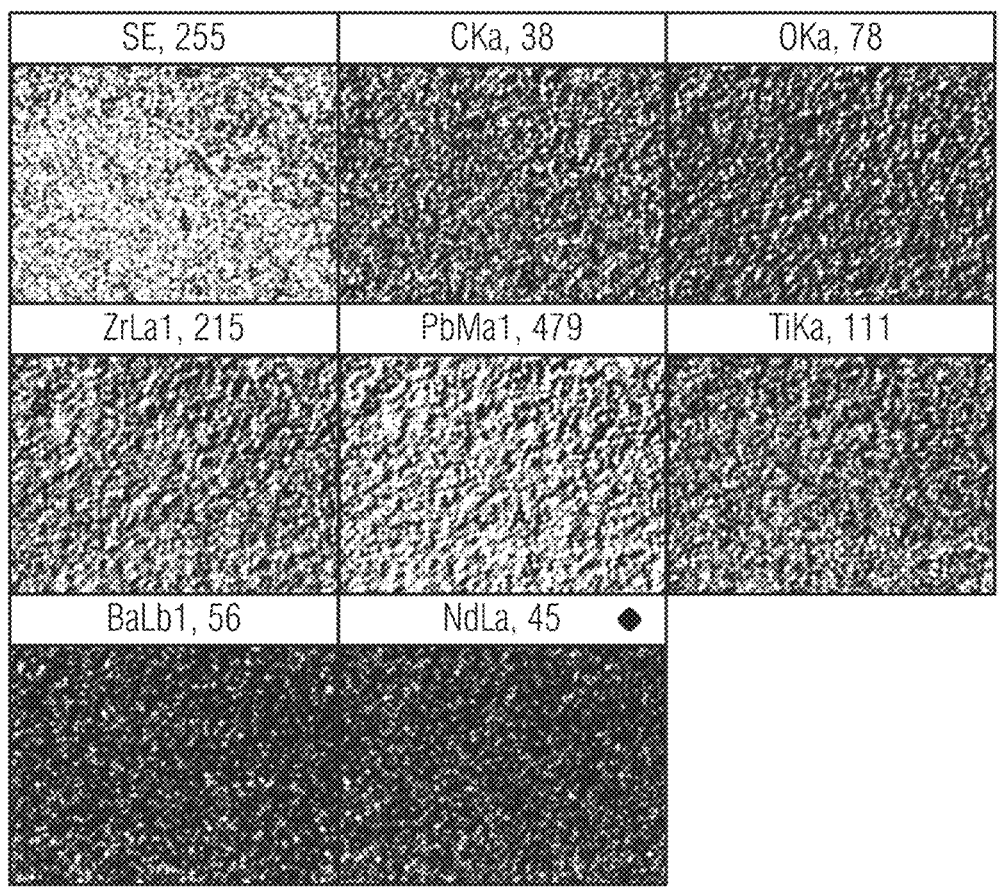

FIGS. 12a) to d) show a scanning electron microscope image of a breakage face of a component comprising $BaTiO_3$ in the auxiliary material layer and also an EDX analysis and mapping of the image.

FIG. 1 shows a schematic side view of a piezoelectric multilayer component in the form of a piezo actuator. The component comprises a stack 1 of piezoelectric layers 10 arranged one above another and internal electrodes 20 lying between them. The internal electrodes 20 are formed as electrode layers. The piezoelectric layers 10 and the internal electrodes 20 are arranged one above another. Weakening layers 21 are shown in FIG. 1 between piezoelectric layers 10 and parallel to the internal electrodes 20. The weakening layer 21 is to be understood to be a region in which predetermined breaking points are present in the component.

The piezoelectric layers 10 contain a ceramic material, for example lead zirconate titanate (PZT) or a lead-free ceramic. The ceramic material may also contain dopants. The internal electrodes 20 contain, for example, a mixture or an alloy of Cu and Pd.

In order to produce the stack 1, for example, green sheets which contain a ceramic powder, an organic binder and a solvent are produced by sheet drawing or sheet casting. An electrode paste is applied by means of screen printing to some of the green sheets, in order to form the internal electrodes 20. Furthermore, plies containing an auxiliary material having a first and a second component are applied to one or more green sheets in order to form weakening layers 21. The green sheets are stacked one above another along a length direction and compressed. The intermediate products of the components are separated in the desired shape from the sheet stack. Lastly, the stack of piezoelectric green sheets, plies of auxiliary material and electrode layers is sintered. External electrodes 30, which are also shown in FIG. 1, are furthermore applied after the sintering.

In the embodiment shown here, the external electrodes 30 are arranged on opposing side faces of the stack 1 and extend in the form of strips along the stacking direction. The external electrodes 30 contain, for example, Ag or Cu and may be applied to the stack 1 as a metal paste and fired in.

The internal electrodes 20 are led along the stacking direction alternately as far as one of the external electrodes 30 and are at a distance from the second external electrode 30. In this way, the external electrodes 30 are electrically connected alternately to the internal electrodes 20 along the stacking direction. In order to produce the electrical connection, a connection element (not shown here) may be applied to the external electrodes 30, for example by soldering.

The production of the multilayer component shown in FIG. 1, which contains weakening layers 21, is to be explained in more detail with the aid of the following exemplary embodiment:

To form the stack 1, a ply containing an auxiliary material is applied to at least one green sheet. A CuPd paste is printed onto green sheets as the electrode material. The auxiliary material contains CuO as the first component and Cu as the second component, where CuO is present in the auxiliary material in a proportion of 10 to 90% by weight, preferably 25 to 75% by weight, in particular of 50% by weight.

If a temperature of approximately 800° C. is then reached during the sintering, at which temperature there is still no compaction of the stack 1, the CuO decomposes into $Cu_2O$ (third component) and $O_2$ (fourth component), and at the same time Cu and CuO react to form $Cu_2O$. The oxygen $O_2$ which is produced by elimination then oxidizes the metallic Cu into CuO, which in turn can further react to form $Cu_2O$. This oxidation thus takes place in a targeted manner in the region of the ply, whereas the Cu in the CuPd paste remains largely unchanged.

As these reactions proceed and/or once they have taken place, the $Cu_2O$ formed and—if it is still present—the CuO diffuse toward the electrode layers 20, which lie closest spatially. As a result, the ply containing the auxiliary material is degraded and therefore the weakening layer 21 is formed. The porosity of the weakening layer can be set or influenced, for example, by the grain size of the CuO used.

The diffusion of the copper oxide or copper oxides CuO and $Cu_2O$ through the piezoelectric layers is particularly effective here, since Cu cations diffuse better than pure Cu. The diffusion per se is promoted by the difference in concentration of Cu which is present in the ply containing the auxiliary material or containing the components formed from the auxiliary material and in the electrode material. The diffusion can take place at the maximum sintering temperature, for example at 1200° C.

Therefore, the Cu in the ply which contains the auxiliary material before the sintering is completely degraded. The copper oxide which has diffused toward the electrode layers is initially absorbed there, and then the oxygen is eliminated again, and therefore pure Cu which accumulates on the CuPd alloy of the electrode material remains.

In an alternative exemplary embodiment, $Pb_3O_4$ can be selected instead of CuO as the first component. This decomposes into PbO and $O_2$, which in turn can oxidize the Cu. The lead oxides are absorbed by the piezoelectric material rather than by the electrode material, and therefore become part of the ceramic layers. As described above, the Cu which is oxidized by the oxygen that forms diffuses as far as the electrode material, where it is absorbed.

FIG. 2a shows an enlarged excerpt of the schematic side view of the multilayer component. The formation of cracks in multilayer components is to be explained with the aid of this figure.

The component expands in the longitudinal direction when a voltage is applied between the external electrodes 30. In a so-called active zone, in which adjacent internal electrodes 20 in the stacking direction overlap, an electric field arises when a voltage is applied to the external electrodes 30, such that the piezoelectric layers 10 expand in the longitudinal direction. In inactive zones, in which adjacent electrode layers 20 do not overlap, the piezo actuator expands only slightly.

On account of the different expansion of the component in the active and inactive zones, mechanical stresses occur in the stack 1. Such stresses can lead to poling cracks and/or relaxation cracks 25 in the stack 1.

FIG. 2a shows an excerpt from a stack 1 composed of piezoelectric layers 10 and internal electrodes 20, wherein a crack 25 has arisen in the stack 1. The crack 25 runs within the inactive zone parallel to the internal electrodes 20, bends away at the transition into the active zone and runs in the active zone through adjacent internal electrodes 20 of differing polarity. This can lead to a short circuit of the internal electrodes 20.

FIG. 2b shows an excerpt from a stack 1 composed of piezoelectric layers 10 and internal electrodes 20, in which a crack 25 has likewise arisen. Here, the crack 25 runs parallel to the internal electrodes 20. In the case of such a course of cracks 25, the risk of short circuits is reduced.

In order to promote such a course of cracks 25, the multilayer component is produced according to the aforementioned method, so that the cracks 25 form in a targeted manner in the region of the weakening layer 21, in which there is a predetermined breaking point.

In a third exemplary embodiment, use is made of a printing paste (auxiliary material) having a Cu proportion of 25% by weight, a CuO proportion of 25% by weight and a $ZrO_2$ proportion of 4.5% by weight (remainder organic binder). The nearest electrode layers are printed with a paste, the metal content of which is composed of 90% by weight Cu and 10% by weight Pd. The zirconium dioxide addition is effected only in conjunction with the auxiliary material. The printed ceramic layers are laminated and compressed. Then, the pressed block is separated into components. These components are decarburized (debinding) in an atmosphere conducive to copper-containing electrodes and lead-containing ceramic at temperatures which produce a low-carbon component. The sintering is likewise effected in a controlled atmosphere at a maximum temperature of 1010° C.

The $ZrO_2$ used has a specific surface area of 13 $m^2/g$, d10V=0.095 µm, d50V=0.55 µm and d90V=2.15 µm. The Si content of the material was 78 ppm.

Micrographs were taken of the components obtained and also of comparative components without a fifth component ($ZrO_2$) in the auxiliary material, and these were examined both by light microscopy and by scanning electron microscopy. In addition, the breaking stress was tested.

The sample surface to be examined is scanned with a very finely focussed electron beam in a scanning electron microscope. The electrons trigger various signals in the sample surface, e.g. secondary electrons, backscattered electrons or characteristic X-ray radiation. These can be registered by suitable detectors. Parallel to the grid on the sample, a screen is scanned and the brightness is controlled by the intensity of the signal from the sample. This provides, with secondary electrons, a high-resolution image of the sample surface (topography contrast), whereas regions of differing chemical composition can be made visible with backscattered electrons (material contrast).

The electrons impinging on the sample surface excite the atoms present there to emit characteristic X-ray radiation. The energy of this radiation is characteristic of each element and the intensity thereof is a measure of the content thereof in the sample point examined (electron beam microanalysis, EDX). The element composition can thus be determined in small regions (resolution approximately one to several micrometers).

If the characteristic X-ray radiation which forms upon scanning a sample face is then registered in a pointwise manner, the concentration distribution of elements over the sample surface examined can be made visible (element distribution images, EDX mapping). In addition to the punctiform and areal analysis, the concentration profile of elements can also be depicted along a line (line scan).

Figure 3B:
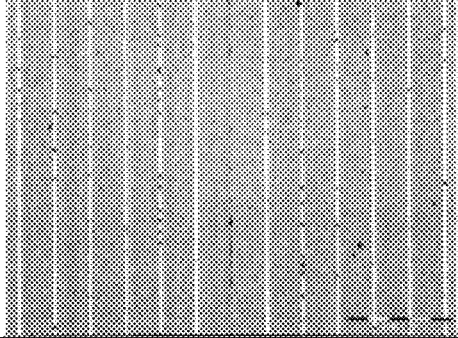

FIGS. 3a) and b) show micrographs of a component having an auxiliary material layer each comprising $ZrO_2$ and without a fifth component. In FIG. 3a), an auxiliary material layer in the center of the component can be seen in a dark color, which indicates a high porosity. The dark color is absent in FIG. 3b).

FIGS. 4a) and b) show a component having an auxiliary material layer each comprising $ZrO_2$ and without a fifth component after a breaking test. The component from FIG. 3a), which comprises $ZrO_2$ in the auxiliary material layer, is distinguished by a low breaking stress of 5-8 MPa, whereas the component without a fifth component had a breaking stress of between 23 and 34 MPa.

To determine the breaking stress (stress upon breakage; unit: MPa), use is made of the four-point bending break method. The component is inserted centrically in such a way that a small isozone becomes visible at the top on the right-hand side. The load roller interval is set centrically to the predefined value of 20 mm. The speed is defined as 5 mm/min. The breaking force determined is converted into a breaking stress with indication of the component geometry. Appliances for carrying out the above measurement method are commercially available. Appliances of this type are marketed, for example, by Zwick/Roell.

Figure 5B:
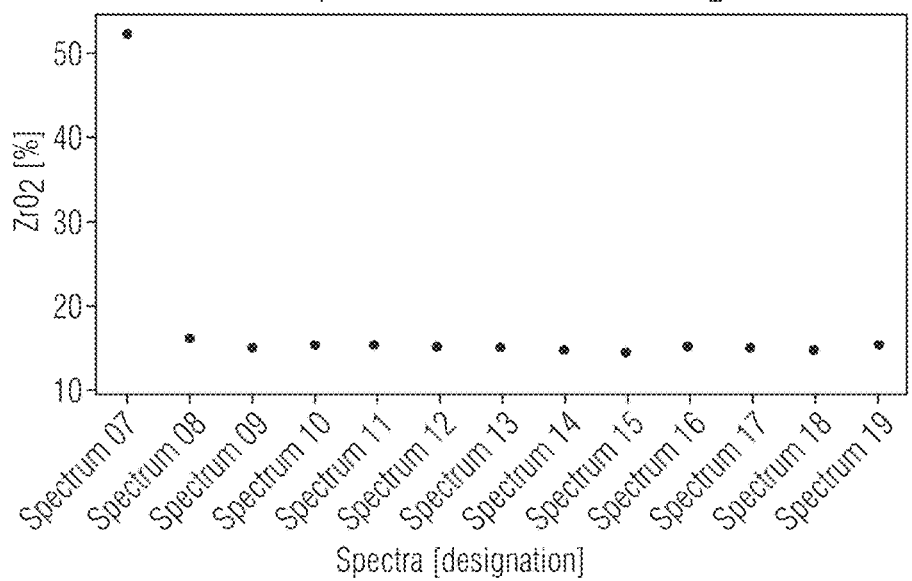
Figure 5C:
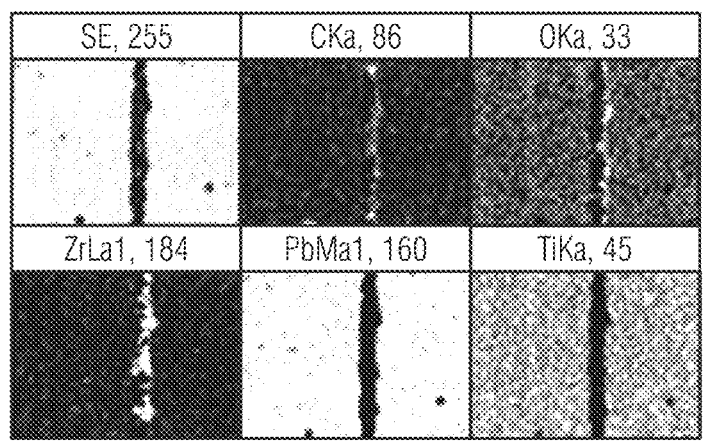

FIG. 5a) to c) show a scanning electron microscope image of a component comprising $ZrO_2$ in the auxiliary material layer and also an EDX analysis and mapping of the image. The light coloration in the mapping denotes a high concentration of an element. It is evident from the EDX analysis (FIG. 5b) and mapping (FIG. 5c) that the $ZrO_2$ accumulates exclusively in the porous layer. Diffusion into the ceramic and a change in the analytical composition of the PZT ceramic cannot be identified.

Figures 6B, 6C:
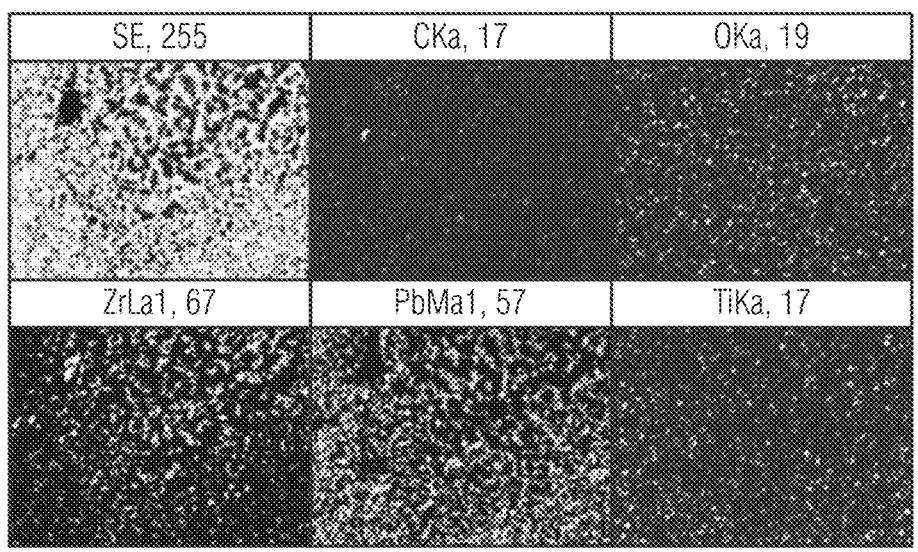

FIG. 6a) to c) show a scanning electron microscope image of a breakage face of a component comprising $ZrO_2$ in the auxiliary material layer and also an EDX analysis and mapping of the image. It is clearly evident that $ZrO_2$ is present on the breakage face. This is confirmed by the EDX analysis (FIG. 6b) and mapping (FIG. 6c).

FIG. 7a) to c) show a scanning electron microscope image of a breakage face of a component without a fifth component in the auxiliary material layer and also an EDX analysis and mapping of the image. It can be identified both in the mapping and in the EDX analysis that there are no analytical differences between the "light" and "dark" points on the breakage face.

Figure 8B:
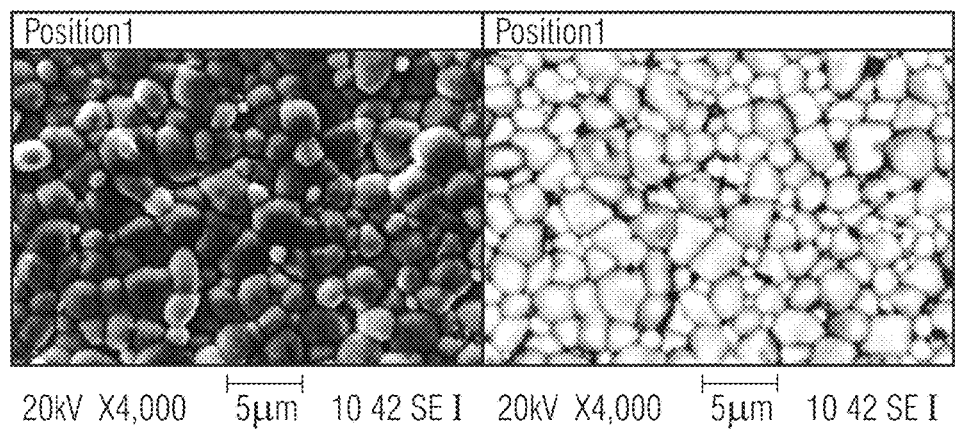
Figure 8C:
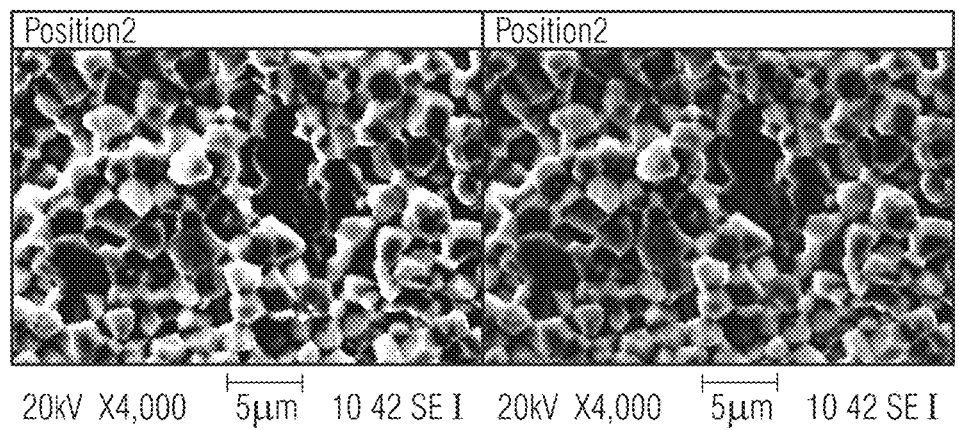

FIG. 8a) to c) show scanning electron microscope images of a breakage face of a component without a fifth component in the auxiliary material layer, with differences in the grain structure being shown. It is clear that the high breaking force arises through the regions with a high degree of sintering of the grains (FIG. 8c).

In a fourth exemplary embodiment, use is made of a printing paste (auxiliary material) having a Cu proportion of 25% by weight, a CuO proportion of 25% by weight and a $BaTiO_3$ proportion of 4.5% by weight (remainder organic binder). The nearest electrode layers are printed with a paste, the metal content of which is composed of 90% by weight Cu and 10% by weight Pd. The barium titanate addition is effected only in conjunction with the auxiliary material. The printed ceramic layers are laminated and compressed. Then, the pressed block is separated into components. These components are decarburized (debinding) in an atmosphere conducive to copper-containing electrodes and lead-containing ceramic at temperatures which produce a low-carbon component. The sintering is likewise effected in a controlled atmosphere at a maximum temperature of 1010° C.

The $BaTiO_3$ used has a specific surface area of 1.5 m²/g, d50V=1.2 µm. The Si content is less than 100 ppm.

Figure 9B:
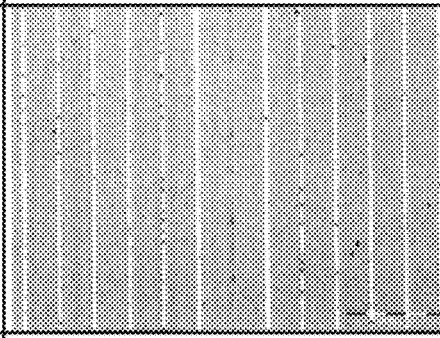

FIGS. 9a) and b) show micrographs of a component having an auxiliary material layer each comprising $BaTiO_3$ and without a fifth component. The relatively high degree of blackening of the auxiliary material layer in the center of FIG. 9a) indicates the relatively high porosity of the layer compared to that shown in FIG. 9b).

FIGS. 10a) and b) show a component having an auxiliary material layer each comprising $BaTiO_3$ and without a fifth component after a breaking test. The breaking stress of the component comprising barium titanate in the auxiliary material layer is 10-19 MPa, whereas the breaking stress of the auxiliary material layer without a fifth component in the auxiliary material layer is 23-34 MPa.

The breakage face on the porous layer comprising barium titanate exhibits regularly distributed light deposits, which are examined by SEM.

FIG. 11a) to c) show a scanning electron microscope image of a component comprising $BaTiO_3$ in the auxiliary material layer and also mapping of the image and an EDX analysis.

FIG. 12a) to c) show a scanning electron microscope image of a breakage face of a component comprising $BaTiO_3$ in the auxiliary material layer and also an EDX analysis and mapping of the image.

The SEM images show that the added concentration of $BaTiO_3$ takes on the desired supporting function to a lesser extent than $ZrO_2$. A large proportion of the auxiliary material has diffused into the ceramic. An increased Ba concentration in the region of the porous layer can only be detected locally. A strong degree of sintering of the grains, as is visible without a fifth component, cannot be observed.

The invention is not limited by the description with reference to the exemplary embodiments. Instead, the invention encompasses any new feature and also any combination of features which, in particular, contains any combination of features in the patent claims, even if this feature or this combination itself is not explicitly indicated in the patent claims or exemplary embodiments.

LIST OF REFERENCE SIGNS

1 Stack
10 Piezoelectric layer
20 Internal electrode
21 Weakening layer
25 Crack
30 External electrodes

What is claimed is:

1. A method for producing a piezoelectric multilayer component, comprising the steps of:
   A) providing an electrode material and green sheets containing a piezoelectric material,
   B) providing an auxiliary material, which contains at least a first and a second component,
   C) forming a stack (1), in which piezoelectric green sheets, at least one ply containing the auxiliary material and layers containing the electrode material are arranged one above another alternately,
   D) debinding the stack to produce a low-carbon stack and sintering the low-carbon stack (1),
   wherein the first and second components of the auxiliary material chemically react during the sintering process of method step D), and the at least one ply is degraded.

2. The method according to claim 1, wherein the electrode material and the auxiliary material are selected in such a way that they contain the same metal, which is present in a smaller proportion in the electrode material than in the auxiliary material.

3. The method according to claim 1 or 2, wherein, in the sintering process of method step D), the first and second components react to form a third component and/or the first component decomposes into a third and a fourth component and the fourth component reacts with the second component to form the first component.

4. The method according to claim 1, wherein, in the sintering process of method step D), the third component and/or the first component diffuse toward at least one of the layers containing electrode material (20).

5. The method according to claim 4, wherein a weakening layer (21) is formed by the diffusion in the region of the ply in the stack (1).

6. The method according to claim 1, wherein CuO is selected as the first component, Cu is selected as the second component and a Cu alloy is selected as the electrode material.

7. The method according to claim 1, wherein the auxiliary material comprises a fifth component, which, at sintering temperatures for the piezoelectric material of at most 1050°

C., has no or negligible sintering activity and does not react with the piezoelectric material used.

8. The method according to claim 7, wherein the fifth component is a ceramic material.

9. The method according to claim 7, wherein the fifth component comprises an element selected from the group consisting of zirconium dioxide, barium titanate and a mixture thereof.

10. The method according to claim 7, wherein the fifth component comprises zirconium dioxide.

11. The method according to claim 7, wherein the fifth component has a silicon content of at most 100 ppm.

12. The method according to claim 7, wherein CuO is selected as the first component, Cu is selected as the second component, $ZrO_2$ is selected as the fifth component and a Cu alloy is selected as the electrode material.

13. A piezoelectric multilayer component comprising a plurality of alternating layers of electrode material and piezoelectric ceramic and at least one layer of auxiliary material having a breaking load which is reduced compared to the other layers of electrode material, wherein the auxiliary material is as defined in claim 7.

14. The piezoelectric multilayer component according to claim 13, wherein the multilayer component has a maximum breaking stress of 20 MPa.

15. The piezoelectric multilayer component according to claim 13, wherein the multilayer component has a maximum breaking stress of 10 MPa.

16. The piezoelectric multilayer component according to claim 13, wherein the multilayer component has a maximum breaking stress of 8 MPa.

* * * * *